United States Patent [19]

Kim

[11] Patent Number: 5,151,341
[45] Date of Patent: * Sep. 29, 1992

[54] RADIATION-SENSITIVE MIXTURE AND PRODUCTION OF RELIEF STRUCTURES

[76] Inventor: Son N. Kim, 9 Zedernweg, 6944 Hemsbach, Fed. Rep. of Germany

[*] Notice: The portion of the term of this patent subsequent to Jul. 23, 2008 has been disclaimed.

[21] Appl. No.: 615,866

[22] Filed: Nov. 20, 1990

[30] Foreign Application Priority Data

Dec. 12, 1989 [DE] Fed. Rep. of Germany ....... 3940965

[51] Int. Cl.$^5$ .............................. G03C 1/492
[52] U.S. Cl. ................... 430/270; 430/272; 430/326; 430/330; 522/31
[58] Field of Search ............... 430/270, 326, 330, 272; 522/31

[56] References Cited

U.S. PATENT DOCUMENTS

| | | | |
|---|---|---|---|
| 3,779,778 | 12/1973 | Smith et al. | 96/115 R |
| 4,491,628 | 1/1985 | Ito et al. | 430/286 |
| 4,587,291 | 5/1986 | Gardziella et al. | 524/595 |
| 4,800,152 | 1/1989 | Allen et al. | 430/270 |
| 4,810,613 | 3/1989 | Osuch et al. | 430/192 |
| 4,883,740 | 11/1989 | Schwalm et al. | 430/905 |
| 5,034,305 | 7/1991 | Nguyen-Kim et al. | 430/270 |
| 5,069,997 | 12/1991 | Schwalm et al. | 430/270 |

FOREIGN PATENT DOCUMENTS

| | | |
|---|---|---|
| 1170393 | 7/1984 | Canada . |
| 1204078 | 5/1986 | Canada . |
| 0282724 | 9/1988 | European Pat. Off. . |
| 0302359 | 2/1989 | European Pat. Off. . |
| 0342498 | 11/1989 | European Pat. Off. . |
| 1539192 | 1/1979 | United Kingdom . |
| 88/0278 | 4/1988 | World Int. Prop. O. . |

OTHER PUBLICATIONS

Iwayanagi et al., *IEEE Transactions on Electron Devices,* vol. ED-28, No. 11, Nov. 1981, pp. 1306-1310.
Matsuzawa et al., *IEEE Transactions on Electron Devices,* vol. ED-28, No. 11, Nov. 1981, pp. 1284-1288.
Hult et al., *Polymers for High Tech.*, ACS Symposium Series, 346, (1987), 163-169.
Tsuge, *Progress in Organic Coatings,* 9, (1981), 107-133.
Hiller, *Plastics and Rubber Processing and Applications,* 1, (1981), 39-42.
Photopolymers Principles—Processes and Materials, (1988), 63-70.
Pampalone, *Solid State Technology,* Jun. 1984, 115-120.

*Primary Examiner*—Marion E. McCamish
*Assistant Examiner*—Mark A. Chapman
*Attorney, Agent, or Firm*—Keil & Weinkauf

[57] ABSTRACT

A radiation-sensitive mixture useful for producing relief structures consists essentially of
(a) a water-insoluble binder or binder mixture which is soluble in aqueous alkali and
(b) a compound which forms a strong acid on irradiation, wherein component (a) contains at least one group

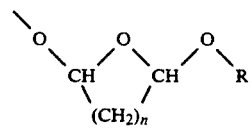

11 Claims, No Drawings

RADIATION-SENSITIVE MIXTURE AND PRODUCTION OF RELIEF STRUCTURES

The present invention relates to radiation-sensitive mixtures which are negative-working and contain a water-insoluble binder which is soluble in aqueous alkali, a compound which forms a strong acid under the action of radiation and groups which by free-acid catalytic action with the binder lead to crosslinking at elevated temperature. These mixtures are sensitive to UV light, electron beams and X-rays and are suitable for use in particular as resist materials.

Negative-working radiation-sensitive mixtures and processes for image production by means of these mixtures are known. Negative-working photoresists are those where imagewise irradiation, with or without an additional heat treatment, of the light-sensitive layer causes the irradiated areas of this layer to become insoluble in the developer in which they were soluble prior to being irradiated.

In general, negative-working photoresists are based on photopolymerizable mixtures which in addition to a polymeric binder contain a photopolymerizable compound and a photoinitiator. Most of the negative-working photoresists used for producing integrated circuits contain almost without exception partially cyclized polyisoprene as crosslinkable component and a diazide compound as light-sensitive difunctional crosslinker. The diazides widely used here are those of the structure (A)

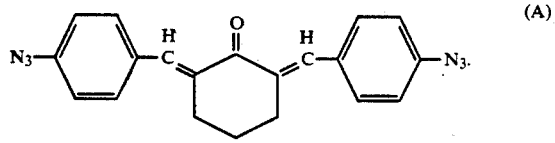

Of late, there have also become available negative-working photoresists which consist of partially cyclized polybutadiene and diazides (cf. also Harita, Y., Ichigawa, M., Harada, K., Polym. Eng. Sci., 17 (1977), 372).

A whole series of negative-working photoresists are also based on photodimerization as crosslinking reaction. They include the cinnamic acid derivatives and the structurally related chalcones. The crosslinking reaction precedes essentially as a light-induced [2+2]-cycloaddition with the formation of cyclobutanes (cf. Williams, J. L. R.: Fortschr. Chem. Forsch., 13 (1969), 277; Reiser, A., Egerton, P. L.: Photogr. Sci. Eng., 23 (1979), 144; M. Kato et al: J. Polym. Sci. part B, Polym. Lett. Ed. 8 (1970), 263; M. Kato et al: Photogr. Sci. Eng., 23 (1979), 207).

Another well-known type of photodimerizable epoxy resin has come to be used as photoresist in recent years (cf. for example DE-A-14 47 016; DE-A-23 42 407; DE-A-25 53 346 and DE-A-24 49 926). These resins carry not only groups which permit photocycloadditions, eg. chalcone radicals, but also epoxy groups which are subsequently crosslinkable by thermal catalysis (cf. Photoresist, New York,: McGraw Hill (1975); GB-B 892 111 and U.S. Pat. No. 2,852,379).

Away from those negative-working photoresists which contain a diazide of the abovementioned structure (A), photoreactions are only possible in the NUV region (ie. at 350–450 μm). New diazide compounds for the shortwave UV region have been described in recent years. They include ketone compounds (cf.J. Electrochem. Soc. 128 (1981) 361) and also sulfur-containing diazide compounds (cf. J. Electrochem. Soc., 127 (1980), 2759).

Even negative-working alkali-developable photoresists which are structurable in shortwave UV are known. They involve the use of poly(p-vinylphenol) as binder and of 3,3'-diazidodiphenyl sulfone (cf. IEEE Trans. Electron Devices, ED. 28 (1981), 1306; IEEE Trans. Electron Devices, ED-28 (1981), 1284). A further alkali-developable negative-working photoresist is based on an onium salt and methylacrylamidoglycolate methyl ether (cf. Hult et al.; Polymers for high Tech. ACS Symposium Series 346 (1987), 162–169), which relies on the principle of acid-catalyzed self-condensation for crosslinking the binder.

A further photopolymerizable composition which is based on an acid-curable material and an iodonium salt as acid donor is known from DE-A-2 602 574.

Even acid-catalytic crosslinkers, which include for example the arylmethylol compounds obtainable as intermediates in the condensation of phenol/formaldehyde resin, were already known (cf. Progr. Org. Coat. 9 (1981), 107; DE-A-29 04 961; Plastics and Rubber Processing and Application 1 (1981), 39; DE-A-32 47 754; EP-A-01 39 309; JP 3051424-A). This acid-catalytic crosslinker has also found an application for photostructurable recording material. EP-A-0282724 discloses a new. negative-working system which is based on poly(p-hydroxystyrene), an acid donor and a crosslinker having at least two protected methylol groups; instead of poly(p-hydroxystyrene) it is also possible to use m-cresol/formaldehyde resin. PCT/US 87/02743 describes a different negative system in which poly(p-hydroxystyrene) or an m-cresol/formaldehyde novolak is again used as binder, a 1,2-quinonediazide is used as acid donor and a 2,6-dimeth-ylol-p-cresol is used as crosslinker (cf. also Photopolymers, Principles-Processes and Materials, 63–70 (1988)). The disadvantages of the two abovementioned systems are: loss of adhesion on overexposure and the leaving behind of a layer of residue, and/or insufficient sensitivity.

DE-A-23 06 248 and EP-A-03 02 359 already disclose radiation-sensitive compositions of matter containing acetal groups, used therein as inhibitors for positive-working recording materials.

It is an object of the present invention to provide new highly active radiation-sensitive systems for preparing shortwave UV-sensitive layers which are developable with aqueous alkali and make it possible to produce structures in the submicron regions which possess thermal stability and stability to plasma.

We have found that this object is achieved in a very advantageous manner by incorporating specific polyfunctional aldehyde acetals.

The present invention accordingly provides a radiation-sensitive mixture consisting essentially of (a) a water-insoluble binder or binder mixture which is soluble in aqueous alkali and
(b) a compound which forms a strong acid on irradiation, wherein component (a) contains at least one group (I)

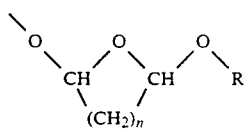 (I)

where R is alkyl of 1 to 5 carbon atoms and n is 2, 3 or 4.

Component (a) is preferably a phenolic resin whose ortho and/or para positions on the phenyl radicals are at least 20% free of substituents, or a mixture of a phenolic resin whose ortho and/or para positions on the phenyl radicals are at least 20% free of substituents and a novolak different therefrom.

Component (a) can be in particular poly(p-hydroxystyrene) or poly(p-hydroxy-α-methylstyrene) having an average molecular weight $\overline{M}_w$ of from 200 to 200,000 in which some of the hydroxyl groups are replaced by radicals of the group (I).

Examples of component (a) can also include those wherein at least 5, preferably from 20 to 60, mol% of the monomer units forming the binder (a) contain groups (I).

Preference is also given to those radiation-sensitive mixtures according to the present invention whose binder (a) contains groups (II) and (III)

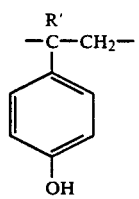 (II)

and

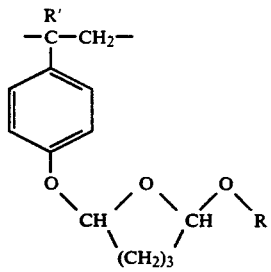 (III)

where R is as defined above and R' is H or CH₃.

The radiation-sensitive mixture according to the present invention generally contains component (a) in an amount of from 50 to 99% by weight and component (b) in an amount of from 1 to 50% by weight.

Component (b) is preferably a sulfonium or iodonium salt of the general formula (IV) or (V)

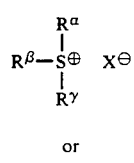 (IV)

or

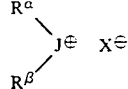 (V)

where $R^\alpha$, $R^\beta$ and $R^\gamma$ are identical or different and each is alkyl of 1 to 3 carbon atoms, aryl, substituted aryl or aralkyl, and $X^\ominus = ClO_4^\ominus$, $AsF_6^\ominus$, $SbF_6^\ominus$, $PF_6^\ominus$, $BF_4^\ominus$ and/or $CF_3SO_3^\ominus$, in particular those where at least one of $R^\alpha$, $R^\beta$ and $R^{65}$ is a radical of the general formula (VI)

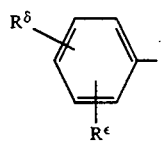 (VI)

where $R^\delta$ and $R^\epsilon$ are identical or different and each is H, OH, or alkyl or alkoxy each of from 1 to 4 carbon atoms,

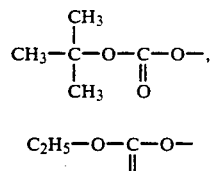

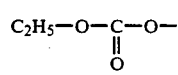

or

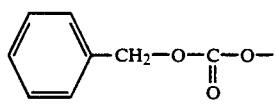

The radiation-sensitive mixture according to the invention may also additionally contain a sensitizer which absorbs radiation and transfers it to component (b).

The present invention also provides a process for producing light-sensitive coating materials and a process for producing relief structures by applying a radiation-sensitive mixture in a film thickness of from 0.1 to 5 μm to a conventionally pretreated substrate, drying at from 70° to 130° C., subjecting to imagewise exposure, heating to 70° to 160° C. and developing with an aqueous alkali, which comprises using a radiation-sensitive mixture according to the present invention.

The present invention also provides a process for preparing a phenolic resin which is suitable for use as a binder (a) in a radiation-sensitive mixture according to the present invention and which contains a group of the formula

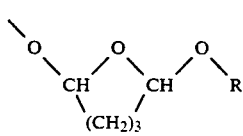 (I)

R is alkyl of from 1 to 5 carbon atoms, which comprises reacting a phenolic resin which contains free phenolic hydroxyl groups with a 3,4-dihydro-2-alkoxypyran containing from 1 to 5 carbon atoms in the alkoxy group by acid catalysis.

The radiation-sensitive mixtures according to the present invention are notable for high sensitivity and good structuring properties, but in particular for very firm adhesion to silicon oxide surfaces.

The following observations concern detailed aspects of radiation-sensitive mixtures, their formative components and their use. a) Suitable water-insoluble but alkali-soluble binders are phenolic resins, preferably those whose ortho and/or para positions on the phenyl radicals are at least 20%, preferably up to 66%, free of substituents, eg. novolaks having average molecular weights $\overline{M}_w$ of from 300 to 20,000, preferably of from 500 to 5000, for example novolaks based on p-cresol/-formaldehyde, in particular poly(p-hydroxystyrenes), poly(p-hydroxy-α-methylstyrenes), for example of average molecular weights $\overline{M}_w$ of from 200 to 200,000, preferably of from 5000 to 40,000, and mixtures of such phenolic resins.

Suitable novolaks also include for example those novolaks which are described in Novolak Resins Used in Positive Resist Systems by T. Pampalone in Solid State Technology, June 1984, pages 115 to 120. Certain applications, for example exposure in shortwave UV, are preferably met with novolaks formed from p-cresol and formaldehyde.

Preferred components (a) are those which contain groups (II) and (III), ie. are formed from polymerized units of phenolic monomers having a free ortho and/or para position, eg. p-hydroxystyrene, and polymerized units of at least one different vinyl monomer containing the group (I).

Such products can be prepared in a conventional manner, for example by reacting phenolic polymers with 3,4-dihydro-2-methoxypyran by acid catalysis.

The radiation-sensitive mixtures according to the present invention generally contain component (a) in amounts of from 50 to 99, preferably from 85 to 97, percent by weight of the total amount of components (a)+(b).

Suitable acid donors (b) are all those compounds which form a strong acid on irradiation. However, preference for use in connection with a shortwave irradiation is given to sulfonium salts of the general formula (IV)

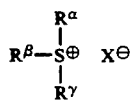     (IV)

where $R^\alpha$, $R^\beta$ and $R^{65}$ are identical or different and each is alkyl of from 1 to 3 carbon atoms, eg. methyl or ethyl, aryl, eg. phenyl, substituted aryl, eg. substituted phenyl, or aralkyl, eg. benzyl, and $X^\ominus = ClO_4^\ominus$, $AsF_6^\ominus$, $SbF_6^\ominus$, $PF_6^\ominus$, $BF_4^\ominus$ and/or $CF_3SO_3^\ominus$ (=triflate).

Of these sulfonium salts, preference is given to those of the general formula (IV) where at least one of $R^\alpha$, $R^\beta$ and $R^\gamma$ is the radical (VI)

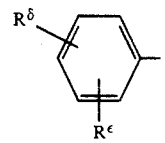     (VI)

where $R^\delta$ and $R^\epsilon$ are identical or different and each is H, OH, alkyl or alkoxy of from 1 to 4 carbon atoms, eg. methyl, ethyl or acyl, such as

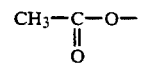

or one of the radicals

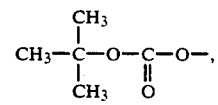

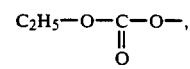

and

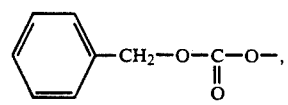

Examples of suitable sulfonium salts are triphenylsulfonium hexafluoroarsenate or hexafluorophosphate and dimethyl-4-hydroxyphenylsulfonium triflate or hexafluoroarsenate.

It is also possible to use other acid donors as component (b), for example iodonium compounds of the abovementioned general formula (V).

Component b is in general present in the radiation-sensitive mixture according to the present invention in amounts of from 1 to 50, preferably from 3 to 15, percent by weight, based on the total amount of components (a)+(b).

The mixtures according to the present invention are preferably dissolved in an organic solvent, the solids content generally ranging from 5 to 40% by weight. Preferred solvents are aliphatic ketones, ethers and mixtures thereof, in particular ethylcellosolve, butylglycol, methylcellosolve, 1-methoxy-2-propanol, alkylene glycol alkyl ether esters, eg. methylcellosolve acetate, ethylcellosolve acetate, methylpropylene glycol acetate and ethylpropylene glycol acetate, ketones, eg. cyclohexanone, cyclopentanone and methyl ethyl ketone, and also acetates, such as butyl acetate, and aromatics, such as toluene and xylene. The choice of solvent or solvent mixture depends on the particular choice of phenolic polymer, novolak and photosensitive component.

Furthermore, it is possible to add other additives such as adhesion promoters, wetting agents, dyes and plasticizers.

If necessary, it is also possible to add small amounts of sensitizers in order to sensitize the compounds in the longwave UV to visible regions. Polycyclic aromatics such as pyrene and perylene, are preferred for this purpose, but it is also possible to use other dyes which act as sensitizers.

The solution of the radiation-sensitive mixture according to the present invention can be filtered through a filter having a pore diameter of 0.2 μm.

The resist solution is applied to a wafer (for example a surface-oxidized silicon wafer) by spin-coating at a speed of from 1000 to 10,000 r.p.m. to produce a resist film from 0.1 to 5 μm in thickness. The wafer is then dried at 90 or 80° C for from 1 to 5 minutes (for example on a hotplate).

In the process for preparing relief patterns according to the present invention, a radiation-sensitive recording layer consisting essentially of the radiation-sensitive mixture according to the present invention is subjected to such a dose of imagewise irradiation that the solubility of the irradiated areas in aqueous alkali increases following a bake at from 70° C. to 160° C. and these areas can be selectively removed with an alkaline developer.

The resist films are irradiated for example through a chromium-coated structured quartz mask with UV light from a mercury lamp, with excimer laser light, with electron beams or with X-rays. Following imagewise irradiation, the films are then baked at from 110° C. to 120° C. for from 5 seconds to 5 minutes and thereafter developed with aqueous alkali, and the irradiated areas are dissolved away selectively while the nonirradiated areas are hardly affected, if at all.

In the Examples which follow, the parts and percentages are by weight, unless otherwise stated.

Preparation of acetal-containing poly(p-hydroxystyrene)

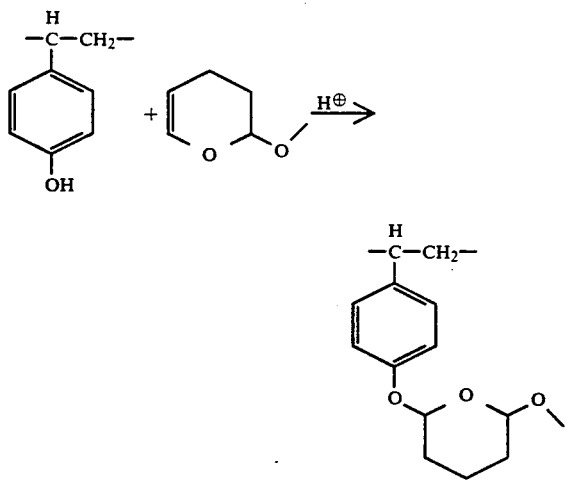

10 parts of poly(p-hydroxystyrene) (=commercial product from Polysciences Inc., $\overline{M}_w$ 1500-7000) and 15 parts of 3,4-dihydro-2-methoxy-2H-pyran were dissolved in 100 parts of ethyl acetate. Following the addition of from 0.1 to 0.5 part of concentrated HCl (36% strength), the batch was stirred for 1 hour and left to stand at room temperature overnight. Following neutralization with NaHCO: solution, the organic phase was separated off and evaporated under reduced pressure at from 25° to 70° C. The polymer was dissolved in 100 parts of ethyl acetate, precipitated in 2000 parts of naphtha and filtered off with suction.

EXAMPLE 1

A photoresist solution is prepared from 95 parts of the above-described acetal-containing poly(p-hydroxystyrene), 5 parts of triphenylsulfonium hexafluoroarsenate and 280 parts of cylohexanone. The solution is then filtered through a filter having a pore diameter of 0.2 μm.

The resist solution is applied to an oxidized silicon wafer in a film 1 μm thick by spin-coating. The wafer thus coated is then dried at 90° C. for 1 minute and subsequently irradiated with excimer laser light of wavelength λ=248 nm through a contact test mask. The irradiation energy is 15 mJ/cm². This is followed by a bake at 120° C. for 1 minute and development with developer of pH 12.0-14.00.

EXAMPLE 2

A photoresist solution is prepared from 95 parts of the above-described acetal-containing poly(p-hydroxystyrene), 5 parts of diphenyliodonium hexafluorophosphate and 280 parts of cyclohexanone.

Example 1 is repeated. The sensitivity for a film thickness of 1 μm is 45 mJ/cm².

Triphenylsulfonium hexafluoroarsenate and diphenyliodonium hexafluorophosphate are commercial products from Alfa.

EXAMPLE 3

A photoresist solution is prepared from 92 parts of the above-described acetal-containing poly(p-hydroxystyrene), 8 parts of dimethyl(p-hydroxyphenyl)sulfonium triflate and 280 parts of ethylglycol acetate. Example 1 is repeated. The sensitivity of the 1 μm thick film is 35 mJ/cm².

We claim:

1. A negative-working radiation-sensitive mixture consisting essentially of
   (a) a water-insoluble binder or binder mixture which is soluble in aqueous alkali and
   (b) a compound which forms a strong acid on irradiation, wherein component (a) contains at least one group (I)

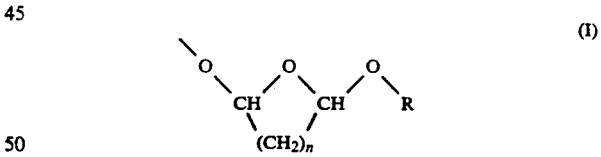

where R is alkyl of 1 to 5 carbon atoms and n is 2, 3 or 4.

2. A radiation-sensitive mixture as defined in claim 1, wherein component (a) is a phenolic resin whose ortho and/or para positions on the phenyl residues are at least 20% free of substituents.

3. A radiation-sensitive mixture as defined in claim 1 wherein component (a) is a mixture of a phenolic resin whose ortho and/or para positions on the phenyl residues are at least 20% free of substituents and a novolak different therefrom.

4. A radiation-sensitive mixture as defined in claim 1, wherein component (a) is poly-(p-hydroxystyrene) or poly(p-hydroxy-α-methylstyrene) having an average molecular weight $\overline{M}_w$ of from 200 to 200,000 in which some of the hydroxyl groups have been replaced by groups (I).

5. A radiation-sensitive mixture as defined in claim 1, wherein at least 5 mol % of the monomer units forming the binder (a) contain the group (I).

6. A radiation-sensitive mixture as defined in claim 5, wherein component (a) contains groups (II) and (III)

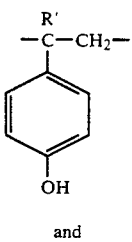

and

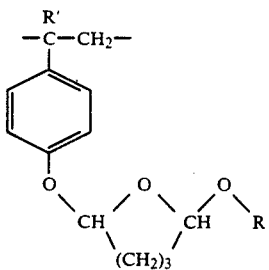

where R is as defined in claim 1 and R' is H or CH$_3$.

7. A radiation-sensitive mixture as defined in claim 1 wherein component (b) is a sulfonium or iodonium salt of the formula (IV) or (V)

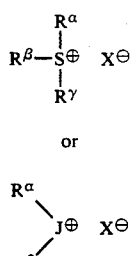

where R$^\alpha$, R$^\beta$ and R$^{65}$ are identical or different and each is alkyl of 1 to 3 carbon atoms, aryl, substituted aryl or aralkyl, and X$^\ominus$ = ClO$_4^\ominus$, AsF$_6^\ominus$, SbF$_6^\ominus$, PF$_6^\ominus$, BF$_4^\ominus$ and/or CF$_3$SO$_3^\ominus$.

8. A radiation-sensitive mixture as defined in claim 7, wherein at least one of R$^\alpha$, R$^\beta$ and R$^\gamma$ is a radical of the formula (VI)

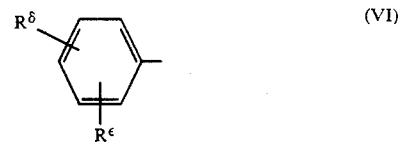

where R$^\delta$ and R$^\epsilon$ are identical or different and each is H, OH, or alkyl or alkoxy each of from 1 to 4 carbon atoms.

9. A radiation-sensitive mixture as defined in claim 1, wherein component (a) is present in an amount of from 50 to 99% by weight and component (b) in an amount of from 1 to 50% by weight.

10. A radiation-sensitive mixture as defined in claim 1, wherein additionally contains a sensitizer which absorbs radiation and transfers it to component (b).

11. A process for producing a relief structure which comprises: applying a radiation-sensitive mixture in a film thickness of from 0.1 to 5 μm to a conventional pretreated substrate, said mixture consisting essentially of
  (a) a water-insoluble binder or binder mixture which is soluble in aqueous alkali and
  (b) a compound which forms a strong acid on irradiation, wherein component (a) contains at least one group (I)

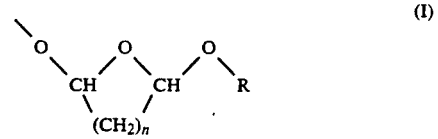

where R is alkyl of 1 to 5 carbon atoms and n is 2, 3 or 4, drying the mixture at from 70° to 130° C., subjecting the mixture to image-wise exposure, heating the exposed mixture to 70° to 160° C. and developing the mixture with an aqueous alkali.

* * * * *

UNITED STATES PATENT AND TRADEMARK OFFICE
CERTIFICATE OF CORRECTION

PATENT NO. : 5,151,341

DATED : September 29, 1992

INVENTOR(S) : KIM

It is certified that error appears in the above-identified patent and that said Letters Patent is hereby corrected as shown below:

Column 9:

Claim 7, line 46: "$R^{65}$" should read -- $R^{Y}$ --

Claim 7, column 10, line 1: "$X\theta=ClO4$" should read -- $X\theta=ClO_4$ --

Claim 10, column 10, line 22: Delete "wherein" and insert -- which --

Signed and Sealed this

Eleventh Day of January, 1994

Attest:

BRUCE LEHMAN

*Attesting Officer*      Commissioner of Patents and Trademarks